(12) United States Patent
Moller et al.

(10) Patent No.: US 6,791,419 B1
(45) Date of Patent: Sep. 14, 2004

(54) CONSTANT GAIN, CONSTANT PHASE RF POWER BLOCK

(75) Inventors: Thomas Moller, Gilroy, CA (US); William Hart, Plano, TX (US); James Mogel, Boyertown, PA (US); Robert Bartola, Pottstown, PA (US)

(73) Assignee: Ericsson, Inc., Morgan Hill, CA (US)

( * ) Notice: Subject to any disclaimer, the term of this patent is extended or adjusted under 35 U.S.C. 154(b) by 0 days.

(21) Appl. No.: 09/205,238

(22) Filed: Dec. 2, 1998

(51) Int. Cl.[7] ............................................. H03F 3/04
(52) U.S. Cl. ................................. 330/297; 330/285
(58) Field of Search ........................ 330/297, 65, 66, 330/68, 285

(56) References Cited

U.S. PATENT DOCUMENTS

| | | | | |
|---|---|---|---|---|
| 5,010,293 A | * | 4/1991 | Ellersick | 323/278 |
| 5,396,194 A | * | 3/1995 | Williamson et al. | 330/297 |
| 5,442,317 A | * | 8/1995 | Stengel | 330/297 |
| 5,604,924 A | * | 2/1997 | Yokoya | 330/297 |
| 5,694,305 A | * | 12/1997 | King et al. | 363/21 |
| 5,826,170 A | * | 10/1998 | Hirschfield et al. | 330/279 |
| 5,834,977 A | * | 11/1998 | Machara et al. | 330/297 |
| 5,847,610 A | * | 12/1998 | Fujita | 330/298 |

\* cited by examiner

*Primary Examiner*—Robert Pascal
*Assistant Examiner*—Khanh Van Nguyen
(74) *Attorney, Agent, or Firm*—Lyon & Lyon LLP

(57) ABSTRACT

A constant gain, constant phase RF power block, e.g., for use in a RF amplifier apparatus. In a preferred embodiment, the power block includes a DC to DC power supply circuit co-located with an RF power transistor device on a common heat sink. The power supply circuit has as an input a varying DC voltage and as outputs a constant supply voltage and a constant bias voltage. The power device has as inputs the constant supply voltage and the constant bias voltage, and further configured to receive and amplify an RF signal. The power supply circuit preferably includes a first laser trimmable resistor for setting the constant supply voltage and a second laser trimmable resistor for setting the bias voltage. In this manner, the constant supply and bias voltages may be easily tuned to a desired level during assembly of the power block device. The input and amplified RF signals are each matched to a relatively high impedance, e.g., approximately fifty ohms.

15 Claims, 2 Drawing Sheets

CONSTANT GAIN, CONSTANT PHASE RF POWER BLOCK

BACKGROUND OF THE INVENTION

1. Field of the Invention

The present invention pertains generally to the field of power transistors and, more particularly, to methods and apparatus for providing a constant gain, constant phase RF power transistor block for use in, e.g., a base station receivers in a high frequency wireless communication networks.

2. Background

The use of radio frequency (RF) power transistors, for example, as amplifiers in wireless communication networks, is well known. With the considerable recent growth in the demand for wireless services, such as personal communication services (PCS), the operating frequency of wireless networks has increased dramatically and is now well into the gigahertz (GHz). At such high frequencies, consistent performance characteristics of RF power transistor amplifier devices becomes increasingly more complex.

In particular, RF amplifier requirements demand highly linear performance to meet the demands of new digital systems, such as CDMA, HDTV, WCDMA, GSM, etc. Cellular systems are especially demanding, because the power transistor devices are expected to maintain the same output characteristics, even if the main power fails and back-up DC battery kicks in. This is problematic, since the voltage supplied by such back-up DC battery systems can vary widely.

Production of RF power transistors on a large scale basis is also a problem, because of natural variables which the devices possess. In particular, the transistor devices have natural variances in output gain and signal phase shift, especially over varying input voltages. Thus, in commercial implementations, significant time and effort is needed to first characterize each RF transistor device over the range of expected operating voltages, and then attempt to "tune" the device to deliver a desired output gain and phase. However, the ability to successfully tune transistor devices is limited, due to the fact that the transistors will often exhibit differing gain and/or phase variations over identical operating voltage changes.

One known technique is to match the transistor output to a higher impedance, e.g., 50 ohms, which greatly reduces the possibility of variations in gain or phase caused by being placed in different amplifier circuit configurations. While this technique can greatly reduce problems in proving constant performance gain and phase delay output across different transistor devices, it does not completely solve the problem. This is because all RF transistors, if taken in a large enough sample size, will have gain and phase delay variations for any specific voltage. This variation can make large scale production of advanced RF amplifiers extremely time consuming and costly. Further, if the operating voltage provided to the amplifier changes, such as when a base station loses main power and goes on battery back-up, the gain and phase delay changes in the devices will not be known, without time consuming and expensive individual "try and fail" tuning.

By way of illustration, even if two RF transistor devices could be "tuned" in respective identical amplifier circuits to have output gain of 11 dB gain, 6 degrees phase change at an input voltage of 28 v dc, a drop in the input voltage to 27.5 v dc would likely cause different results in the respective RF transistors, e.g., with the output of one changing to 10.9 dB and 6 degrees phase delay, and the other changing to 10.7 dB and 5.8 degrees phase delay. This difference in operating characteristics between transistor devices is problematic for the manufactures and users of the RF transistors.

Thus, it would be advantageous to provide RF power transistor amplifier devices that have a constant gain and phase delay output over a wide variation in input voltages.

SUMMARY OF THE INVENTION

In accordance with a first aspect, the present invention provides a constant gain, constant phase RF power block, e.g., for use in a RF amplifier apparatus. In a preferred embodiment, the power block includes a DC to DC power supply circuit having as an input a varying DC voltage and as outputs a constant supply voltage and a constant bias voltage. A power transistor circuit is provided adjacent the power supply circuit, the power transistor circuit having as inputs the constant supply voltage and the constant bias voltage, and further configured to receive and amplify an RF signal.

In accordance with a further aspect of the invention, the power supply circuit includes means for setting the supply and bias voltage levels. In one preferred embodiment, a first laser trimmable resistor is provided for setting the supply voltage and a second laser trimmable resistor is provided for setting the bias voltage. In this manner, the constant supply and bias voltages may be easily tuned to a desired level during assembly of the power block device. In an alternate preferred embodiment, the supply and bias voltages are set with respective potentiometers.

In accordance with a still further aspect of the present invention, the power supply circuit may comprise either a sepic converter (i.e., which either steps up or steps down the input voltage) or a forward converter (i.e., which steps down the input voltage).

In accordance with yet another aspect of the present invention, the input and amplified RF signals are each matched to a relatively high impedance, e.g., approximately fifty ohms in a preferred embodiment.

In another preferred embodiment, the present invention provides an amplifier apparatus, comprising a heat sink. A DC to DC power supply circuit having as an input a varying DC voltage and as outputs a constant supply voltage and a constant bias voltage, includes a transformer housing secured to the heat sink. A power transistor device having as inputs the constant supply voltage and the constant bias voltage, includes a mounting flange secured to the heat sink. In accordance with a still further aspect of the present invention, the transformer housing and flange are attached to the heat sink proximate each other.

As will be apparent to those skilled in the art, other and further aspects and advantages of the present invention will appear hereinafter.

BRIEF DESCRIPTION OF THE DRAWINGS

Preferred embodiments of the present invention are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
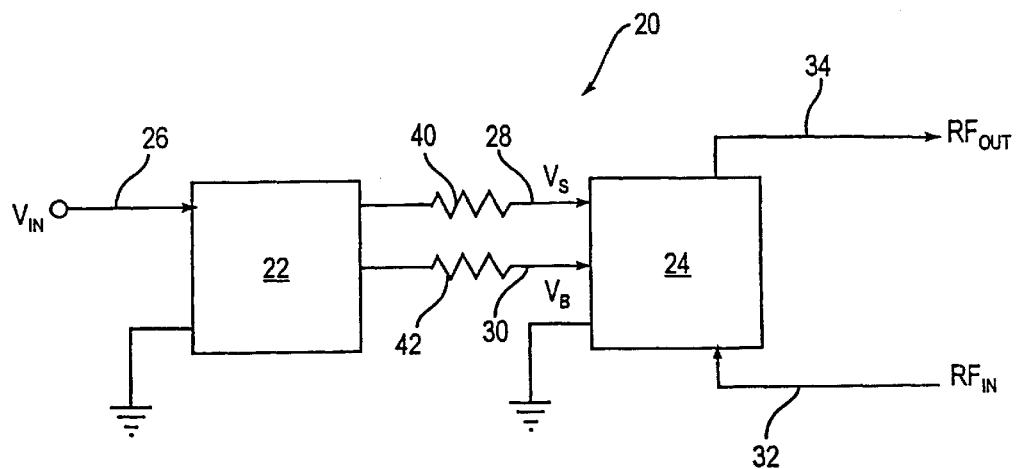
FIG. 1 is a simplified block diagram of a constant gain, constant phase RF power block provided in accordance with the present invention.

Referring to FIG. 1, a preferred constant gain, constant phase delay RF power block 20 includes generally a DC to DC power supply circuit 22 having as an input a varying DC voltage 26 and as outputs a constant supply voltage 28 and a constant bias voltage 30. The power supply circuit 22 may be a step up, step down, or a sepic converter, i.e., which is capable of either stepping up or stepping down the input voltage 26 to generate the output supply voltage 28.

By way of example, in one preferred embodiment, the power supply circuit 22 includes a sepic converter that can provide a constant output voltage of approximately twenty-eight volts DC from an input voltage 26 that may vary over a range of nine to thirty-six volts DC. By way of further example, in another preferred embodiment, the power supply circuit 22 includes a step down converter that can provide a constant output supply voltage of approximately twenty-eight volts DC from an input voltage 26 that may vary over a range of thirty-six to seventy-two volts DC. As is apparent to those skilled in the art, any number of converter topologies may be employed, including multiple converter topologies, depending on the particular input voltage range that will be encountered in a given application and the required output supply voltage 28.

The RF power block 20 also generally includes an RF power transistor circuit 24, which has as inputs the constant supply voltage 28 and the constant bias voltage 30, respectfully. The power transistor circuit 24 is configured to receive as a further input an RF signal input 32, wherein the RF signal 32 is amplified and output 34 by the power transistor circuit 24.

In order to better stabilize the transistor circuit 24, which generally operates a relatively low impedance, both the RF input signal 32 and (amplified) output signal are matched to a relatively high impedance, e.g., 50 ohms in a preferred embodiment.

A first laser trimmable resistor 40 is used to set the supply voltage, and a second laser trimmable resistor 42 is used to set the bias voltage. In this manner, during assembly, the supply and bias voltage outputs 28 and 30 may be adjusted (or "tuned") by laser ablation of a portion of the respective resistors 40 and 42. In an alternate preferred embodiment (not shown), the supply and bias voltages may be set with respective potentiometers.

An advantage of the RF power block 20 over the prior art is that the gain and phase delay of the RF output signal 34 may be held constant over a broad range of input voltages 26. Prior to deployment of the RF power block 20 in an amplifier apparatus, the respective supply and bias voltages 28 and 30 are preferably tuned (i.e., by ablating portions of the respective resistors 40 and 42) to give the amplified RF signal 34 a desired gain and phase delay. Because (as explained above) each RF power transistor will have slightly different performance characteristics, the respective input voltages 28 and 30 may also vary to achieve identical gain and phase delay outputs between devices. In other words, variations in a given RF power transistor are compensated for by adjusting the voltage it "sees."

By way of example, two exemplary RF power blocks (designated as 20 and 20') may have the following characteristics: For block 20, in order to achieve a constant output gain of 11 dB and 6.2 degrees phase delay, the input supply and bias voltages are tuned to 28.2 v and 3.5 v, respectively. For block 20', in order to achieve an identical constant output gain of 11 dB and 6.2 degrees phase delay, the input supply and bias voltages are tuned to 27.9 v and 3.3 v, respectively. An advantage of this aspect of the present invention, however, is that once the initially input voltages (28 and 30) are tuned, the output gain and phase will be substantially identical across different devices and over a broad range of input voltages.

Figure 2:
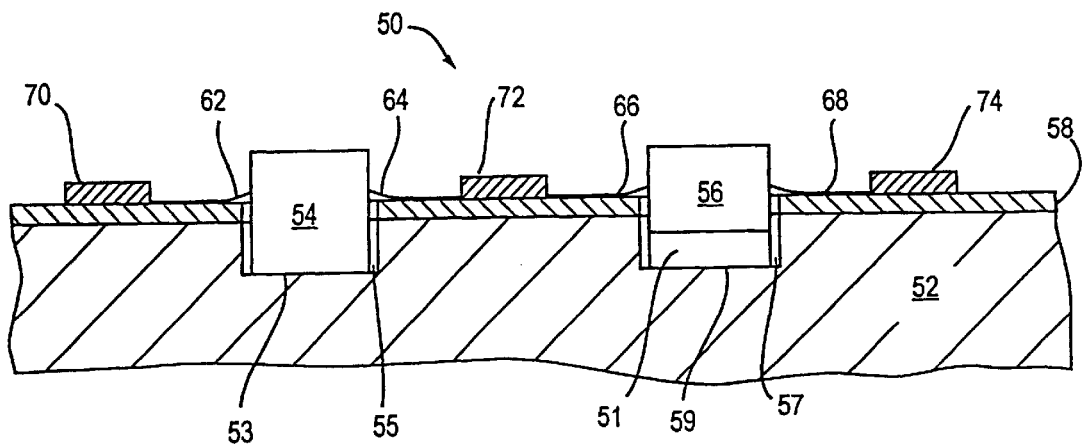
FIG. 2 is a partial side view of a prototype design of preferred a constant gain, constant phase delay RF power block, illustrating use of a common heat sink for the respective dc/dc converter and RF transistor components of the power block.

Referring to FIG. 2, a further aspect of the present invention is illustrated, as follows:

An amplifier device including an RF power block 50 comprises a metal heat sink 52, e.g., made of copper or aluminum. Bonded atop portions of the heat sink is a printed circuit (pc) board 58. Other portions of the heat sink 52 remain exposed, with device wells 55 and 57 formed in the heat sink 52 to accommodate a transformer housing 54 and RF power transistor device 56, respectively, of the RF power block 50. In particular, a bottom surface 53 of the transformer housing 54 is attached (e.g., by solder, screws, or some other accepted method) to the heat sink surface in device well 55. A bottom surface 59 of a mounting flange 51 of the transistor device 56 is similarly attached to the heat sink surface in device well 57.

The transformer housing 54 has leads 62 and 64 and the transistor device 56 has leads 66 and 68 coupled to the pc board 58, wherein the respective leads 62,64,66,68 are merely shown for illustration. In fact, each device 54 and 56 will have multiple other leads coupled to the pc board, depending on the particular implementation. The power block 50 further includes power supply control circuitry 70 disposed on the pc board 58 and coupled to a transformer (not shown) in the transformer housing 54 via one or more of the leads 62 and 64. Bias control circuitry 72 is located on the pc board between the transformer housing 54 and RF transistor device 56, and is connected to the transformer via one or more of leads 62 and 64, and to the transistor device via one or more of the leads 66 and 68. Further RF signal processing circuitry 74 is also coupled to the power transistor device 56 via one or more of the leads 66 and 68.

As will be apparent to those skilled in the art, other power supply construction techniques may be employed, such as, e.g., planar or integrated magnetics, depending upon the particular application in which the RF power block is employed.

Like the RF power transistor device, the transformer (and thus the housing 54) generates significant heat, and requires a direct heat sink contact. Co-locating both devices 54 and 56 on the same heat sink 52 provides for significant cost savings, as the heat sink 52 represents a substantial portion of the cost of a typical RF apparatus.

Figure 4:
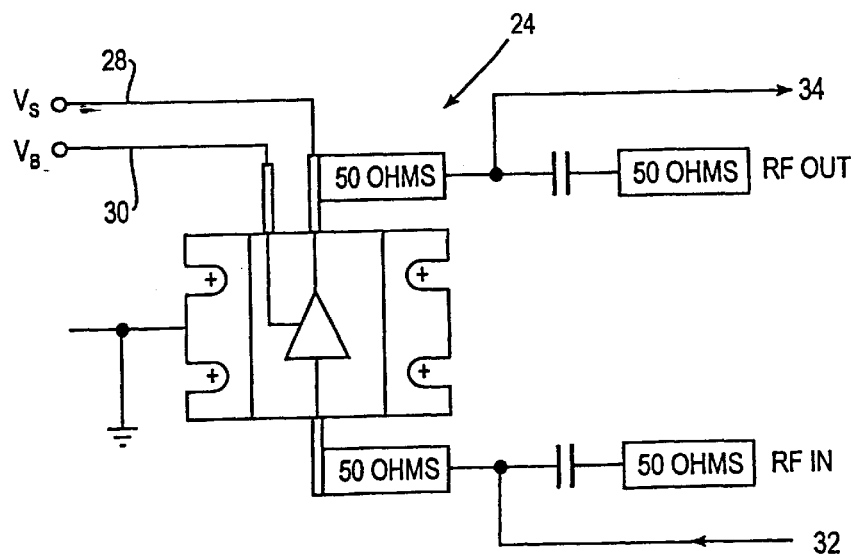
FIG. 4 is a schematic illustration of a preferred RF amplifier circuit for use in the RF power block of FIG. 2.
Figure 3:
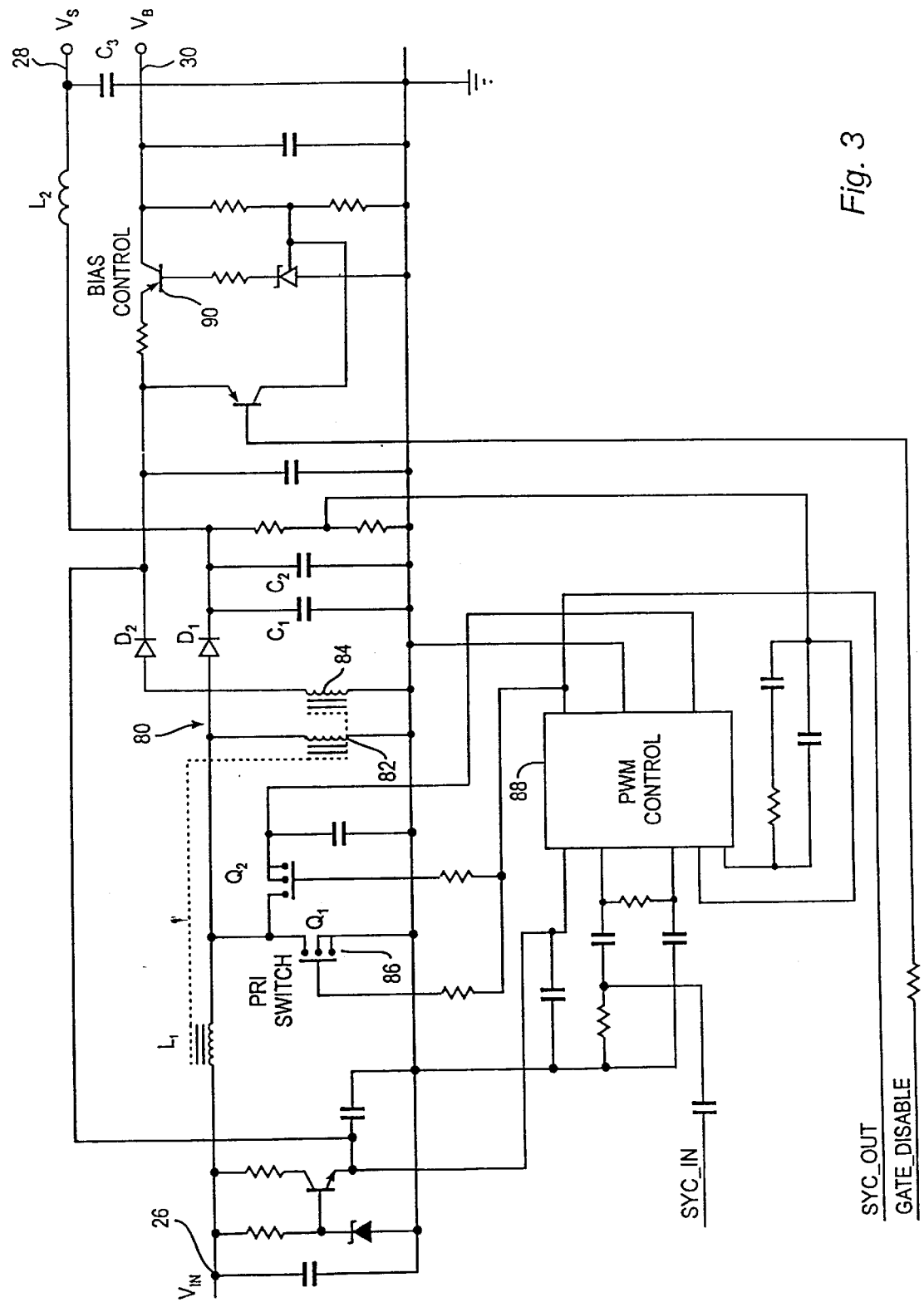
FIG. 3 is a schematic illustration of a preferred dc/dc converter circuit for use in the RF power block of FIG. 2.

FIGS. 3 and 4 are schematic diagrams of a presently preferred RF power block 20 and are provided to better illustrate the preferred embodiment of the present invention shown in FIG. 1, wherein like components are given the same reference numbers. Generally, the power supply circuitry includes a transformer 80 with a primary side winding 82 and one or more secondary windings 84. Operation of the power supply is controlled by a primary winding transistor switch 86 operated by PWM control circuitry 88. The output bias voltage is set through transistor 90.

In an alternate embodiment, it may be desirable to dynamically control the supply and bias voltages, e.g., by adjusting the duty cycle of the PWM controller 88 based on feedback monitoring of the actual gain and phase delay of the device. Although such a system would allow for more precise control of the gain and phase delay of the power block, it would be more expensive to implement.

While preferred embodiments and applications of a constant gain, constant phase delay RF power block have been shown and described, as would be apparent to those skilled in the art, many modifications and applications are possible without departing from the inventive concepts herein.

Thus, the scope of the disclosed invention is not to be restricted except in accordance with the appended claims.

What is claimed is:

1. A constant gain, constant phase delay RF gain block, comprising:
   a DC to DC power supply circuit having as an input a varying DC voltage and as outputs a constant supply voltage and a constant bias voltage; and
   an RF power transistor circuit having as inputs the supply voltage and the bias voltage, and further configured to receive and amplify an RF signal.

2. The RF gain block of claim 1, wherein the power supply circuit comprises a sepic converter.

3. The RF gain block of claim 1, wherein the power supply circuit comprises a step down converter.

4. The RF gain block of claim 1, wherein the power supply circuit comprises a step up converter.

5. An amplifier apparatus, comprising:
   a heat sink;
   a DC to DC power supply circuit having as an input a varying DC voltage and as outputs a constant supply voltage and a constant bias voltage, the power supply circuit comprising a transformer housing secured to the heat sink; and
   an RF power transistor device having as inputs the supply voltage and the bias voltage, the power transistor device comprising a flange secured to the heat sink proximate the transformer housing.

6. The amplifier apparatus of claim 5, wherein the power transistor device:
   receives as a further input an RF signal; and
   provides as an output an amplified RF signal.

7. The amplifier apparatus of claim 6, wherein the input and output RF signals are each matched to a high impedance.

8. The amplifier apparatus of claim 6, wherein the input and output RF signals are each matched to an impedance of approximately fifty ohms.

9. The amplifier apparatus of claim 5, wherein the power supply circuit further comprises means for tuning the supply voltage and means for tuning the bias voltage.

10. The amplifier apparatus of claim 9, wherein the means for tuning the supply voltage and the bias voltage comprise a first laser trimmable resistor for setting the supply voltage and a second laser trimmable resistor for setting the bias voltage.

11. An amplifier apparatus, comprising:
    a heat sink,
    a DC to DC power supply circuit having as an input a varying DC voltage and as outputs a constant supply voltage and a constant bias voltage, the power supply circuit comprising
    means for setting the supply voltage,
    means for setting the bias voltage, and
    a housing secured to the heat sink;
    an RF power transistor device having as inputs the constant supply voltage and the constant bias voltage, the power transistor device comprising a flange secured to the heat sink, and further configured to:
    receive as a further input an RF signal,
    amplify the RF signal, and
    provide as an output the amplified RF signal,
    wherein the input and output RF signals are each matched to a relatively high impedance.

12. The amplifier apparatus of claim 11, wherein the input and output RF signals are each matched to an impedance of approximately fifty ohms.

13. The amplifier device of claim 11, wherein the power supply housing and flange are attached to the heat sink proximate each other.

14. A constant gain, constant phase delay RF gain block, comprising:
    a DC to DC power supply circuit having as an input a varying DC voltage and as outputs a constant supply voltage and a constant bias voltage;
    an RF power transistor circuit having as inputs the supply and bias voltages, and further configured to receive and amplify an RF signal; and
    wherein the power supply circuit comprises a first laser trimmable resistor to set the supply voltage and a second laser trimmable resistor to set the bias voltage.

15. A constant gain, constant phase delay RF gain block, comprising:
    a DC to DC power supply circuit having as an input a varying DC voltage and as outputs a constant supply voltage and a constant bias voltage;
    an RF power transistor circuit having as inputs the supply voltage and the bias voltage, and further configured to receive and amplify an RF signal; and
    wherein the power transistor circuit outputs the amplified RF signal, and wherein the input and output RF signals are each matched to a high impedance.

* * * * *